(12) United States Patent
Kulas

(10) Patent No.: US 9,520,305 B2
(45) Date of Patent: Dec. 13, 2016

(54) POWER SEMICONDUCTOR ARRANGEMENT AND METHOD OF PRODUCING A POWER SEMICONDUCTOR ARRANGEMENT

(71) Applicant: Semikron Elektronik GmbH & Co., KG, Nümberg (DE)

(72) Inventor: Hartmut Kulas, Ebermannstadt (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/503,303

(22) Filed: Sep. 30, 2014

(65) Prior Publication Data

US 2015/0091151 A1 Apr. 2, 2015

(30) Foreign Application Priority Data

Sep. 30, 2013 (DE) ........................ 10 2013 110 815

(51) Int. Cl.
*H01L 23/48* (2006.01)
*H01L 21/48* (2006.01)
(Continued)

(52) U.S. Cl.
CPC ....... *H01L 21/4878* (2013.01); *H01L 21/4882* (2013.01); *H01L 23/055* (2013.01);
(Continued)

(58) Field of Classification Search
CPC ............ H01L 2924/01004; H01L 2924/01005; H01L 2924/01014; H01L 2924/01015; H01L 2924/01019; H01L 2924/01024; H01L 2924/01042; H01L 2924/01046; H01L 2924/01067; H01L 2924/01072; H01L 21/4878; H01L 21/4882; H01L 23/055; H01L 23/367; H01L 23/3735; H01L 23/473; H01L 24/32; H01L 24/83; H01L 2224/32225; H01L 2224/83801; H01L 2224/8384; H01L 2924/13055; H05K 7/20927
(Continued)

(56) References Cited

U.S. PATENT DOCUMENTS 6,112,779 A * 9/2000 Camilla .......................... 141/23
6,917,482 B2 * 7/2005 Minamino et al. ........... 359/819
(Continued)

FOREIGN PATENT DOCUMENTS

DE 10 2010 043 446 1/2012
EP 2613351 7/2013
(Continued)

OTHER PUBLICATIONS

Search Report of the German Patent and Trademark Office in priority case, dated Jun. 4, 2014.
(Continued)

*Primary Examiner* — Xinning Niu
*Assistant Examiner* — Vu A Vu
(74) *Attorney, Agent, or Firm* — The Law Offices of Roger S. Thompson

(57) ABSTRACT

A power semiconductor device comprising a power semiconductor module and a heat sink; and a method for its manufacture. The module has a cooling plate, with an opening delimited by a lateral first surface thereof extending circumferentially around the opening. The cooling plate is arranged in the opening and has a lateral first surface which extends circumferentially around the cooling plate. The two first surfaces are at a respective angle of less than 90° with respect to a main surface of the cooling plate facing the power semiconductor components. The two first surfaces are pressed together, extending circumferentially along the first
(Continued)

surface of the cooling plate and extending circumferentially along the first surface of the heat sink. The inventive power semiconductor device has good heat conduction from the power semiconductor components to the heat sink through which a liquid can flow, and which is reliably leaktight over the long term.

10 Claims, 6 Drawing Sheets

(51) Int. Cl.
*H01L 23/473* (2006.01)
*H01L 23/055* (2006.01)
*H01L 23/373* (2006.01)
*H01L 23/367* (2006.01)
*H05K 7/20* (2006.01)
*H01L 23/00* (2006.01)

(52) U.S. Cl.
CPC ........ *H01L 23/367* (2013.01); *H01L 23/3735* (2013.01); *H01L 23/473* (2013.01); *H05K 7/20927* (2013.01); *H01L 24/32* (2013.01); *H01L 24/83* (2013.01); *H01L 2224/32225* (2013.01); *H01L 2224/8384* (2013.01); *H01L 2224/83801* (2013.01); *H01L 2924/13055* (2013.01); *H01L 2924/13091* (2013.01)

(58) Field of Classification Search
USPC .......................................................... 257/69
See application file for complete search history.

(56) References Cited

U.S. PATENT DOCUMENTS

| | | | |
|---|---|---|---|
| 7,900,692 B2 * | 3/2011 | Miyahara | ................. 165/104.26 |
| 8,310,044 B2 | 11/2012 | Takahashi | |
| 8,730,672 B2 | 5/2014 | Ebersberger | |
| 2009/0065178 A1 | 3/2009 | Kasezawa | |
| 2010/0263848 A1 | 10/2010 | Aoki | |
| 2012/0181679 A1* | 7/2012 | Kadoguchi et al. | .......... 257/676 |
| 2012/0235293 A1 | 9/2012 | Jones | |
| 2012/0320529 A1 | 12/2012 | Loong | |
| 2013/0094145 A1 | 4/2013 | Campbell | |
| 2013/0154084 A1 | 6/2013 | Kadoguchi | |

FOREIGN PATENT DOCUMENTS

| | | |
|---|---|---|
| JP | H11-243170 A | 9/1999 |
| JP | H11-317478 A | 11/1999 |

OTHER PUBLICATIONS

Extract of EP Search Report for parallel case, dated Mar. 25, 2015.

* cited by examiner

POWER SEMICONDUCTOR ARRANGEMENT AND METHOD OF PRODUCING A POWER SEMICONDUCTOR ARRANGEMENT

BACKGROUND OF THE INVENTION

1. Field of the Invention

The invention relates to a power semiconductor device and a method for producing a power semiconductor device.

2. Description of the Related Art

In known power semiconductor devices, power semiconductor components, such as, e.g., power semiconductor switches and diodes, are usually arranged on a substrate and are electrically conductively connected to one another by a conductor layer of the substrate, and bonding wires and/or a film composite. In this case, power semiconductor switches are generally present in the form of transistors, such as, e.g., IGBTs (Insulated Gate Bipolar Transistors) or MOSFETs (Metal Oxide Semiconductor Field Effect Transistors).

In such known devices, the power semiconductor components arranged on the substrate are often electrically interconnected to form one or more individual so-called half-bridge circuits, which are used, e.g., for rectifying and inverting electrical voltages and currents.

During the operation of such a known power semiconductor device, electrical losses occur at the power semiconductor components. These electrical losses lead to heating of the power semiconductor components. To cool the power semiconductor components, conventional power semiconductor devices often utilize a heat sink through which a cooling liquid flows and which is thermally conductively coupled to the power semiconductor components.

German Published Patent Application No. DE 10 2010 043 446 B3 discloses providing a heat sink through which a cooling liquid flows with openings, and arranging the cooling plates of power semiconductor modules having power semiconductor components into the openings. This achieves good dissipation of heat from the power semiconductor components to the cooling liquid. What is disadvantageous in this case is that the cooling plate has to be reliably sealed in relation to the heat sink and over the long term to reliably prevent leakage of cooling liquid over the service life of the power semiconductor device, which is generally envisaged to last for a long time.

SUMMARY OF THE INVENTION

The object of the invention is to provide an improved power semiconductor device with good heat conduction from the power semiconductor components to a heat sink of the power semiconductor device through which a liquid can flow, and in the case of which the heat sink is reliably leaktight over the long term.

This object is achieved by a power semiconductor device comprising a power semiconductor module having electrically conductive conductor tracks with at least one power semiconductor component arranged thereon. The module further includes a cooling plate, having a main surface which faces the at least one power semiconductor component and a lateral first surface which extends circumferentially around the cooling plate and is at an angle ($\alpha$) of less than about 90° with respect to the main surface of the cooling plate. The module still further comprises an electrically non-conductive insulation layer arranged between the conductor tracks and the cooling plate. The power semiconductor device further comprises a heat sink through which a liquid can flow, the heat sink having an opening therein and a lateral first surface which delimits the opening and extends circumferentially around the opening. The first surface of the heat sink is at an angle ($\beta$) of less than about 90° with respect to the main surface of the cooling plate. The cooling plate is arranged in the opening. The lateral first surface of the cooling plate and the lateral first surface of the heat sink are pressed against one another and extend circumferentially along the lateral first surface of the cooling plate and extend circumferentially along the lateral first surface of the heat sink.

Furthermore, this object is achieved by a method for producing a power semiconductor device comprising the following method steps: providing a power semiconductor module having electrically conductive conductor tracks with at least one power semiconductor component arranged thereon. The module further includes a cooling plate having a main surface facing the at least one power semiconductor component and a lateral first surface which extends circumferentially around the cooling plate and is at an angle ($\alpha$) of less than about 90° with respect to the main surface of the cooling plate; and an electrically non-conductive insulation layer arranged between the conductor tracks and the cooling plate. The method further comprises the steps of providing a heat sink through which a liquid can flow, the heat sink having an opening therein and a lateral first surface which delimits the opening and extends circumferentially around the opening; arranging the cooling plate in the opening; and press-fitting the cooling plate into the opening so that the lateral first surface of the cooling plate and the lateral first surface of the heat sink are pressed against one another and extend circumferentially along the lateral first surface of the cooling plate and extend circumferentially along the lateral first surface of the heat sink. The first surface of the heat sink is at an angle ($\beta$) of less than about 90° with respect to the main surface of the cooling plate.

Advantageous embodiments of the inventive method emerge analogously to advantageous embodiments of the power semiconductor device, and vice versa.

For example, it proves to be advantageous if the lateral first surface of the cooling plate extends circumferentially around the cooling plate is at an angle of from about 89.5° to about 85° with respect to the main surface of the cooling plate facing the power semiconductor components, since particularly good pressing of the first surface of the cooling plate and the first surface of the heat sink against one another results in the case of this angular range.

Furthermore, it proves to be advantageous if the first surface of the heat sink is at an angle with respect to the main surface of the cooling plate facing the power semiconductor components. That angle is preferably equal to the angle of the first surface of the cooling plate with respect to the main surface of the cooling plate facing the power semiconductor components, since then the first surface of the heat sink and the first surface of the cooling plate may be pressed against one another over a large circumferentially extending surface region.

It also proves to be advantageous if the heat sink has an opening delimited by the lateral first surface extending circumferentially around the opening and by a lateral second surface of the heat sink also extending circumferentially around the opening, wherein the second surface of the heat sink forms the inner surface of a first groove extending circumferentially around the opening, and an edge region of the cooling plate has a protuberance which extends circumferentially around the cooling plate, the protuberance being arranged in the first groove. Particularly reliable long-term sealing of the cooling plate in relation to the heat sink is achieved as a result.

Furthermore, it proves to be advantageous if the method of manufacture includes the step of deforming a lateral edge region of the cooling plate in such a way that the edge region has a protuberance extending circumferentially around the cooling plate, the protuberance being arranged in the first groove after the lateral edge region of the cooling plate has been deformed. The protuberance brings about additional liquid-tight sealing of the cooling plate in relation to the heat sink and blocks shifting of the cooling plate out of the opening by the positively locking connection of the protuberance to the first groove.

Furthermore, it proves to be advantageous if the process of press-fitting the cooling plate into the opening of the heat sink involves carrying out a process of cutting a circumferentially extending second groove spaced apart from the first surface of the cooling plate into the main surface of the cooling plate facing the power semiconductor components. Efficient production of the power semiconductor device is achieved as a result, wherein the second groove facilitates the process of deforming the lateral edge region of the cooling plate.

Furthermore, it provides to be advantageous if the main surface of the cooling plate has a circumferentially extending second groove spaced apart from the first surface of the cooling plate. The second groove facilitates the process of deforming the lateral edge region of the cooling plate.

Furthermore, it proves to be advantageous if the method is carried out by a tool having a press-fitting stamp and a deforming stamp. The process of press-fitting the cooling plate into the opening of the heat sink is carried out by the press-fitting stamp and the process of deforming the lateral edge region of the cooling plate is carried out by the deforming stamp. The deforming stamp may be arranged so as to be movable relative to the press-fitting stamp and laterally around the press-fitting stamp.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
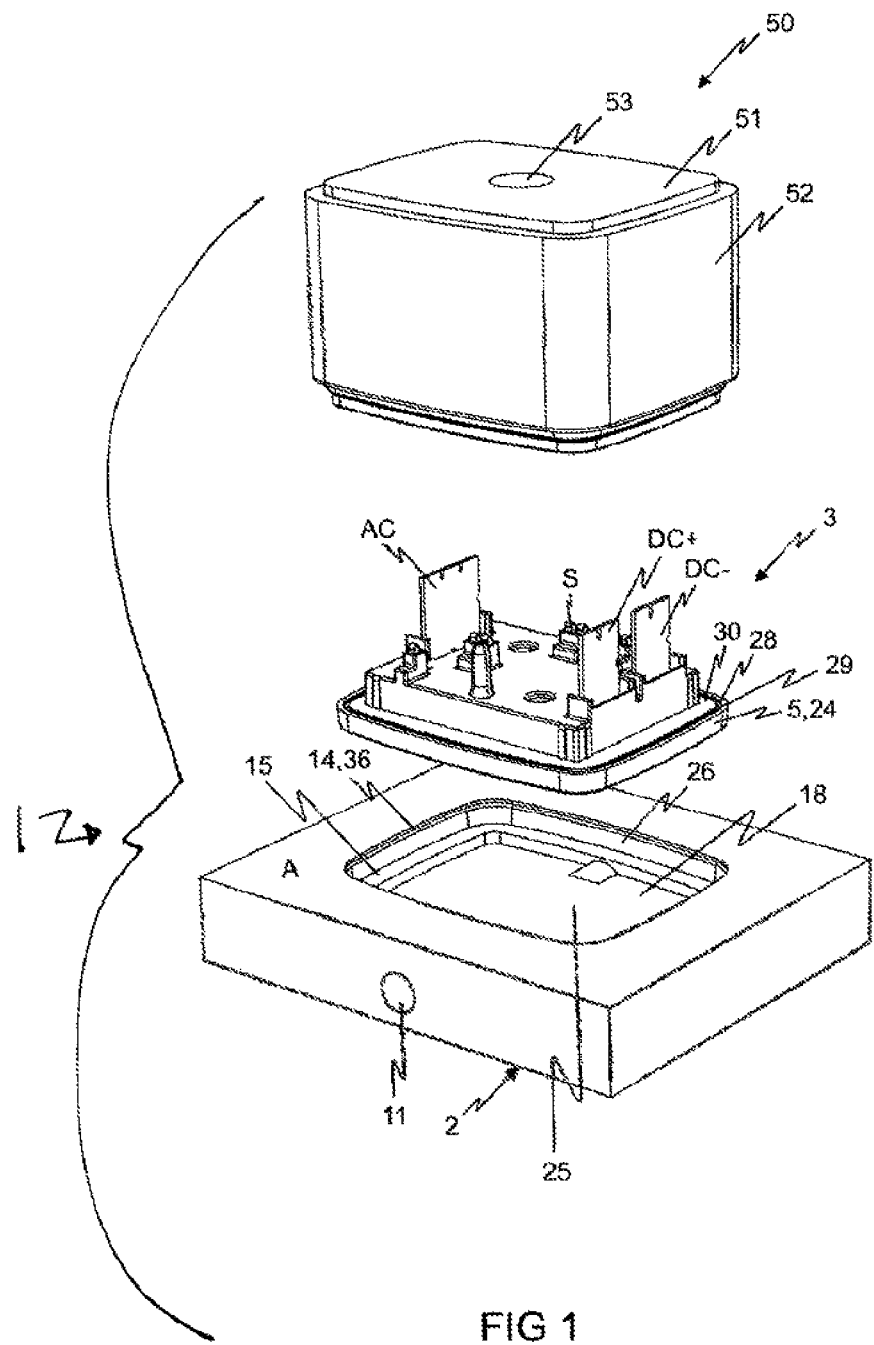
FIG. 1 shows an exploded perspective illustrating a first method step for producing a power semiconductor device according to the invention.
Figure 2:
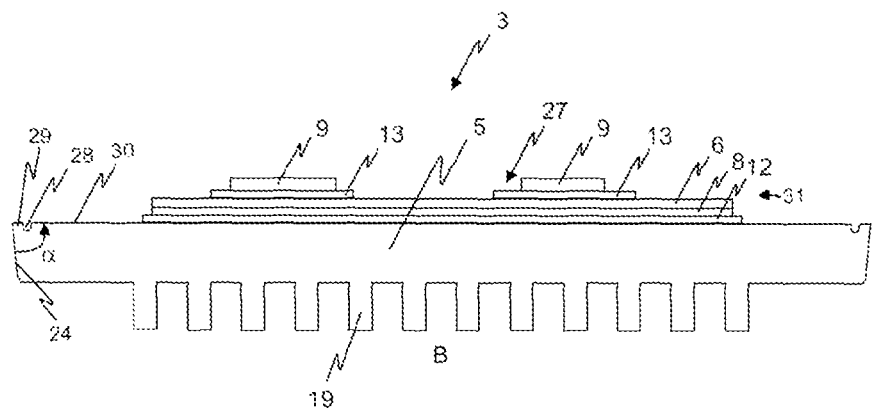
FIG. 2 shows a sectional view of a power semiconductor module.
Figure 6:
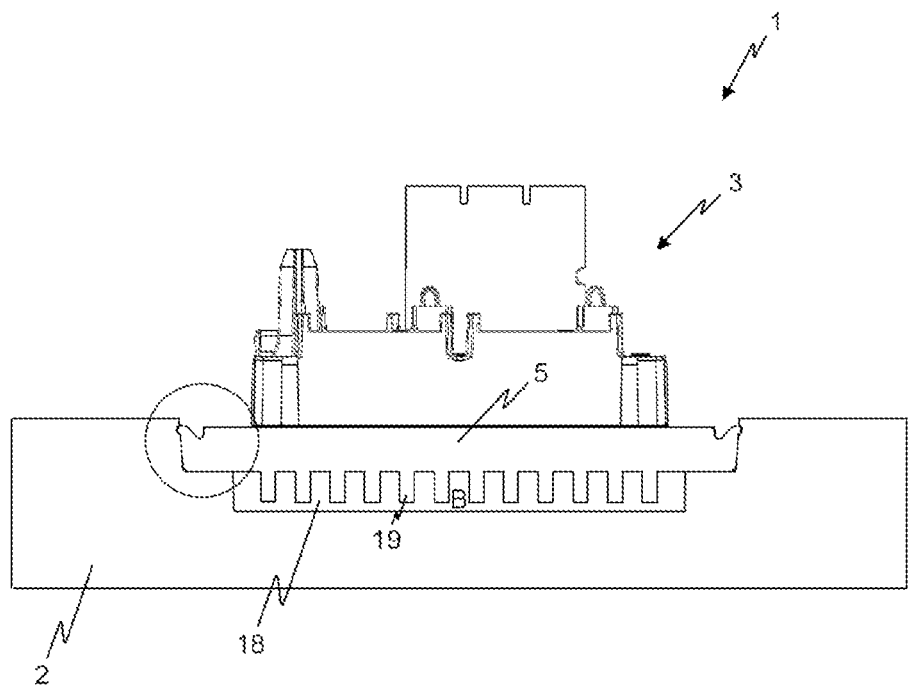
FIG. 6 shows a sectional view of a power semiconductor device according to the invention.

FIG. 1 illustrates a first method step for producing a power semiconductor device 1 according to the invention (see FIG. 6). FIG. 2 illustrates a sectional view of a power semiconductor module 3. Only the elements of the power semiconductor module 3 which are essential for understanding the invention are illustrated in FIG. 2. It should be noted that the sectional elements are illustrated without hatching in FIGS. 2, 3, 6 and 8-10 for the sake of clarity.

The first method step for producing inventive power semiconductor device 1 involves providing a power semiconductor module 3 having power semiconductor components 9 arranged on electrically conductive conductor tracks 13. Power semiconductor module 3 has an electrically non-conductive insulation layer 6 and a cooling plate 5. Insulation layer 6 is arranged between conductor tracks 13 and cooling plate 5. A lateral first surface 24 of cooling plate 5 extends circumferentially around cooling plate 5 and is at an angle α of less than about 90° with respect to a main surface 14 of cooling plate 5 which faces power semiconductor components 9. Preferably, angle α is between about 89.5° to about 85° with respect to a main surface 30 of cooling plate 5 facing power semiconductor components 9. Furthermore, the first method step involves providing a heat sink 2 through which a liquid can flow and which has an opening 25 delimited by a lateral first surface 26 of heat sink 2 extending circumferentially around opening 25.

Power semiconductor module 3 has power semiconductor components 9 arranged on electrically conductive conductor tracks 13. Conductor tracks 13 are formed by an electrically conductive structured first conduction layer 31. Power semiconductor components 9 are electrically conductively connected to conductor tracks 13, preferably by a soldering or sintering metal layer. The respective power semiconductor component 9 is preferably present a power semiconductor switch or a diode. In this case, the power semiconductor switches are preferably transistors, such as, e.g., IGBTs (Insulated Gate Bipolar Transistor) or MOSFETs (Metal Oxide Semiconductor Field Effect Transistor). The respective power semiconductor module 3 preferably has a first DC voltage load current terminal element DC+ and a second DC voltage load current terminal element DC− and an AC load terminal element AC, which are electrically conductively connected to first conduction layer 31, preferably by a soldering or sintering metal layer. In the context of the exemplary embodiment illustrated, the respective power semiconductor module 3 generates an AC voltage at AC voltage load current terminal AC from a DC voltage fed in between the DC voltage load current terminals DC+ and DC−. Furthermore, in the context of the exemplary embodiment, the respective power semiconductor module 3 has control terminal elements S, which are electrically conductively connected to the control terminals of the power semiconductor switches of power semiconductor module 3.

The respective power semiconductor module 3 has an electrically non-conductive insulation layer 6 and a cooling plate 5, wherein insulation layer 6 is arranged between conductor tracks 13 and cooling plate 5. Conductor tracks 13 are connected to insulation layer 6. In the context of the exemplary embodiment, an electrically conductive, preferably unstructured, second conduction layer 8 is arranged between insulation layer 6 and cooling plate 5, and is connected to insulation layer 6. Insulation layer 6 is preferably a ceramic body. First and second conduction layers 31 and 8 and insulation layer 6 are formed together preferably by a direct copper bonded substrate (DCB substrate).

It should be noted at this juncture that the first and second conduction layers can consist of an individual layer or a plurality of layers lying one above another. In this regard, the first and/or the second conduction layer can comprise, e.g., a copper layer having an individual coating or a plurality of coatings lying one another above, e.g., composed of a noble metal (e.g., silver) or composed of a noble metal compound, which can serve, e.g., as adhesion promoting layers and/or protective layers.

Cooling plate 5, at its side facing power semiconductor components 9, can be coated with an individual layer or a plurality of layers lying one above another, which, e.g., respectively can serve as an adhesion promoting layer and/or as a protective layer and/or can serve to reduce mechanical stresses between insulation layer 6 and cooling plate 5 which can occur in the event of temperature changes, on account of different coefficients of thermal expansion of insulation layer 6 and cooling plate 5. In the context of the exemplary embodiment, cooling plate 5 is coated with a copper layer 12 at its side facing insulation layer 6, which copper layer 12 can in turn be coated, e.g., with a coating, in particular a noble metal coating (e.g., silver). Copper layer 12 is arranged between cooling plate 5 and insulation layer 6, and in particular between cooling plate 5 and second conduction layer 8. Second conduction layer 8 is connected to cooling plate 5, preferably by a soldering or sintering metal layer, directly or indirectly (if the cooling plate, at its side facing the power semiconductor components, is coated with an individual layer or a plurality of layers lying one above another). In the context of the exemplary embodiment, second conduction layer 8 is connected to copper layer 12 by a soldering or sintering metal layer.

For the sake of clarity, the soldering or sintering metal layers are not illustrated in FIG. 2. Furthermore, it should be noted that the thickness of the layers and the thickness of the power semiconductor components are not illustrated in a manner true to scale.

It should be noted that this juncture that the cooling plate can also be present in the form of an aluminum body of an insulated metal substrate (IMS).

Cooling plate 5 preferably has cooling fins and/or cooling pins 19 at its side B facing away from power semiconductor components 9.

Heat sink 2 through which a liquid (e.g., water) can flow has an opening 25 at an outer side A thereof facing power semiconductor components 9. In this case, in the finished produced power semiconductor device 1 (see FIG. 6), cooling plate 5 is arranged in opening 25, wherein a part of the respective cooling plate 5 can project from opening 25. Cooling plate 5 closes opening 25. A cavity 18 is formed at a side B of cooling plate 5 facing away from power semiconductor components 9. In the context of the exemplary embodiment, the liquid flows through heat sink 2 by virtue of the fact that, as long as opening 25 is not yet closed by cooling plate 5, the liquid flows into cavity 18 through an inlet opening (the inlet opening is not visible in the perspective of FIG. 1) of heat sink 2, then flows through the cavity 18 and flows out of heat sink 2 through an outlet opening 11 and through opening 25 of heat sink 2. In the context of the exemplary embodiment, the liquid flows through heat sink 2 by virtue of the fact that, if opening 25 is closed by cooling plate 5, the liquid flows into cavity 18 through the inlet opening of heat sink 2, flows through cavity 18 and flows out of heat sink 2 through outlet opening 11. The heat of the respective cooling plate 5 is transferred to the liquid and is transported away by the liquid.

Cooling plate 5 and/or heat sink 2 are preferably formed of aluminum or an aluminum alloy.

Figure 3:
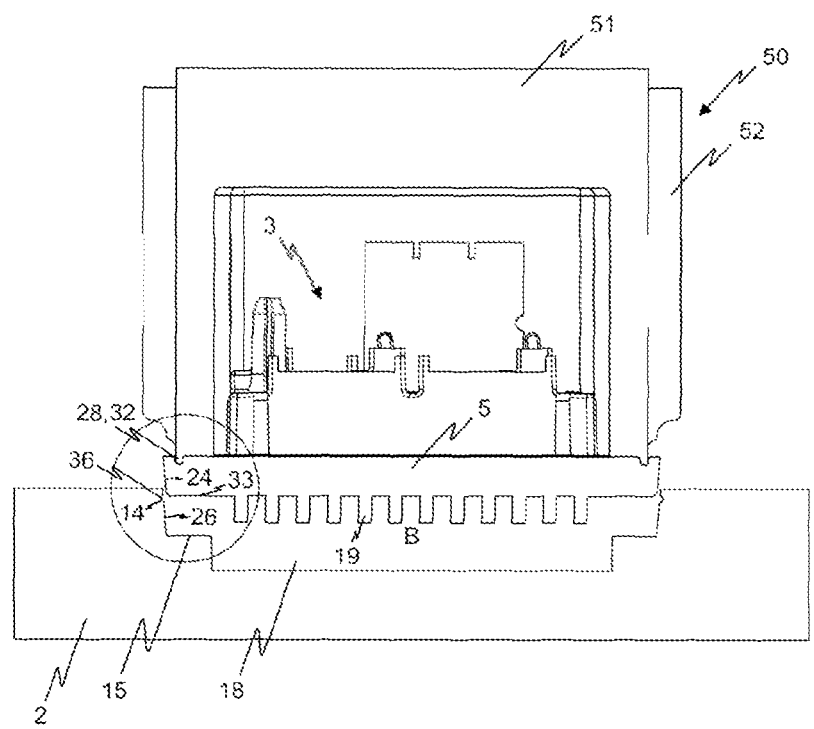
FIG. 3 shows a further method step for producing a power semiconductor device according to the invention.

A further method step involves, as illustrated in FIG. 3, arranging cooling plate 5 at opening 25 of heat sink 2. In the context of the exemplary embodiment, the process of arranging cooling plate 5 at opening 25 of heat sink 2 is carried out by a tool 50 having a press-fitting stamp 51 and a deforming stamp 52. Deforming stamp 52 is arranged so as to be movable relative to press-fitting stamp 51 and laterally around press-fitting stamp 51. A reduced pressure is generated, via an opening 53 of press-fitting stamp 51 (see FIG. 1). The reduced pressure draws cooling plate 5 onto press-fitting stamp 51 and holds it on press-fitting stamp 51.

Figure 4:
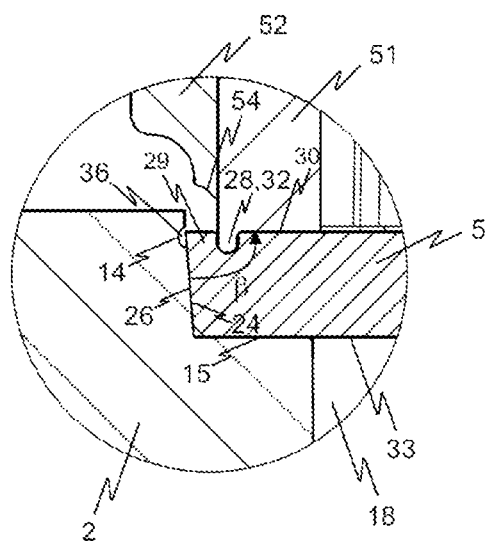
FIG. 4 shows a detail view of a further method step for producing a power semiconductor device according to the invention.

A further method step involves, as illustrated in FIG. 4, press-fitting cooling plate 5 into opening 25 of heat sink 2, wherein, after the press-fitting, first surface 24 of cooling plate 5 and first surface 26 of heat sink 2 are pressed against one another, extending circumferentially along first surface 24 of cooling plate 5 and extending circumferentially along first surface 26 of heat sink 2, wherein first surface 26 of heat sink 2 is at an angle β of less than 90° with respect to main surface 30 of cooling plate 5 facing power semiconductor components 9. Preferably, first surface 26 of heat sink 2 is at an angle β with respect to main surface 30 of cooling plate 5, angle β being substantially equal to angle α of first surface 24 of cooling plate 5 with respect to main surface 30 of cooling plate 5. During the process of press-fitting cooling plate 5 into opening 25 of heat sink 2, cooling plate 5 is pressed into opening 25 to a sufficient depth until first surface 24 of cooling plate 5 and first surface 26 of heat sink 2 are pressed against one another, extending circumferentially along first surface 24 of cooling plate 5 and extending circumferentially along first surface 26 of heat sink 2 (also see FIGS. 8 and 9). First surface 24 of cooling plate 5 and first surface 26 of heat sink 2 are in contact with one another extending circumferentially along first surface 24 of cooling plate 5 and extending circumferentially along first surface 26 of heat sink 2. Cooling plate 5 is press-fitted into opening 25. Preferably, heat sink 2 has a third surface 15, which runs parallel to a second surface 33 of cooling plate 5 facing away from power semiconductor components 9. Third surface 15 of heat sink 2 forms a stop for second surface 33 of cooling plate 5 and delimits the depth to which cooling plate 5 may be press-fit into opening 25. Preferably, cooling plate 5 is pressed into opening 25 to a sufficient depth until second surface 33 of cooling plate 5 bears against third surface 15 of heat sink 2. Through a corresponding choice of the depth at which third surface 15 of heat sink 2 is arranged in heat sink 2, it is possible to define the pressing pressure with which first surface 24 of cooling plate 5 and first surface 26 of heat sink 2 are pressed against one another, extending circumferentially along first surface 24 of cooling plate 5 and extending circumferentially along first surface 26 of heat sink 2. In the exemplary embodiment, the process of press-fitting cooling plate 5 into opening 25 of heat sink 2 is effected by press-fitting stamp 51. By virtue of the fact that first surface 24 of cooling plate 5 and first surface 26 of heat sink 2 are arranged in a manner pressed against one another, extending circumferentially along first surface 24 of cooling plate 5 and extending circumferentially along first surface 26 of heat sink 2, reliable long-term liquid-tight sealing of first surface 26 of heat sink 2 in relation to first surface 24 of cooling plate 5 is achieved (also see FIG. 10). In this way heat sink 2 is reliably leaktight over the long term.

In the context of the exemplary embodiment, opening 25 is delimited by lateral first surface 26 of heat sink 2 extending circumferentially around opening 25 and by a lateral second surface 14 of heat sink 2 extending circumferentially around opening 25, wherein second surface 14 of heat sink 2 forms the inner surface of a first groove 36 which extends circumferentially around opening 25.

Figure 5:
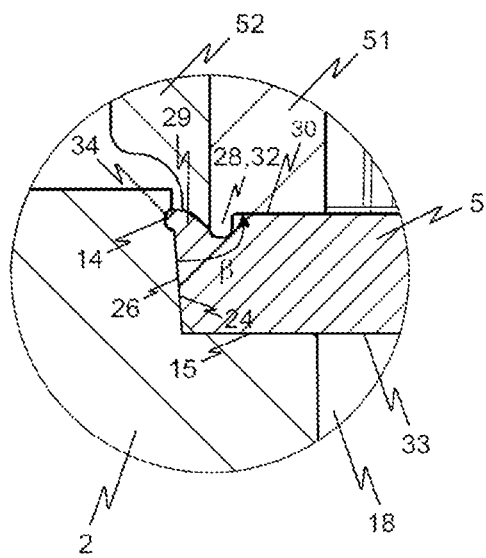
FIG. 5 shows a detail view of a further method step for producing a power semiconductor device according to the invention.

In the context of the exemplary embodiment, a further method step involves, as illustrated in FIG. 5, deforming a lateral edge region 29 of cooling plate 5 in such a way that edge region 29 has a protuberance 34 extending circumferentially around cooling plate 5, protuberance 34 being arranged in first groove 36 after lateral edge region 29 of cooling plate 5 has been deformed. Protuberance 34 brings about additional liquid-tight sealing of cooling plate 5 in relation to heat sink 2 and prevents movement of cooling plate 5 out of opening 25 by the positively locking connection of protuberance 34 to first groove 36. In the exemplary embodiment, the process of deforming lateral edge region 29 of cooling plate 5 is effected by deforming stamp 52. Deforming stamp 52 has a deforming edge 54 (see FIG. 4), which correspondingly deforms the edge region 29 of cooling plate 5 when deforming stamp 52 is moved onto edge region 29 of cooling plate 5.

In the context of the exemplary embodiment, main surface 30 (see FIGS. 1 and 2)—facing power semiconductor components 9—of cooling plate 5 provided in the first method step has a circumferentially extending second groove 28 spaced from first surface 24 of cooling plate 5. Second groove 28 facilitates the deforming of lateral edge region 29 of cooling plate 5. Preferably, press-fitting stamp 51 has a circumferentially extending edge 32 which fits into second groove 28 (see FIG. 3). This makes very precise arrangement of cooling plate 5 at opening 25 of heat sink 2 possible.

Second groove 28 need not already be present at the beginning of the method. Alternatively, the process of press-fitting cooling plate 5 into opening 25 of heat sink 2 can also be performed by cutting a circumferentially extending second groove 28 spaced from first surface 24 of cooling plate 5 into main surface 30 of cooling plate 5 facing power semiconductor components 9. In this case, the circumferentially extending edge 32 of press-fitting stamp 51 is a cutting edge. Efficient production of the power semiconductor device is achieved as a result.

Figure 7:
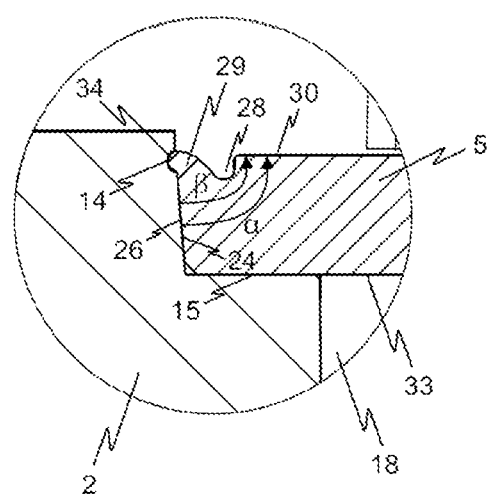
FIG. 7 shows a detail view from FIG. 6.
Figure 8:
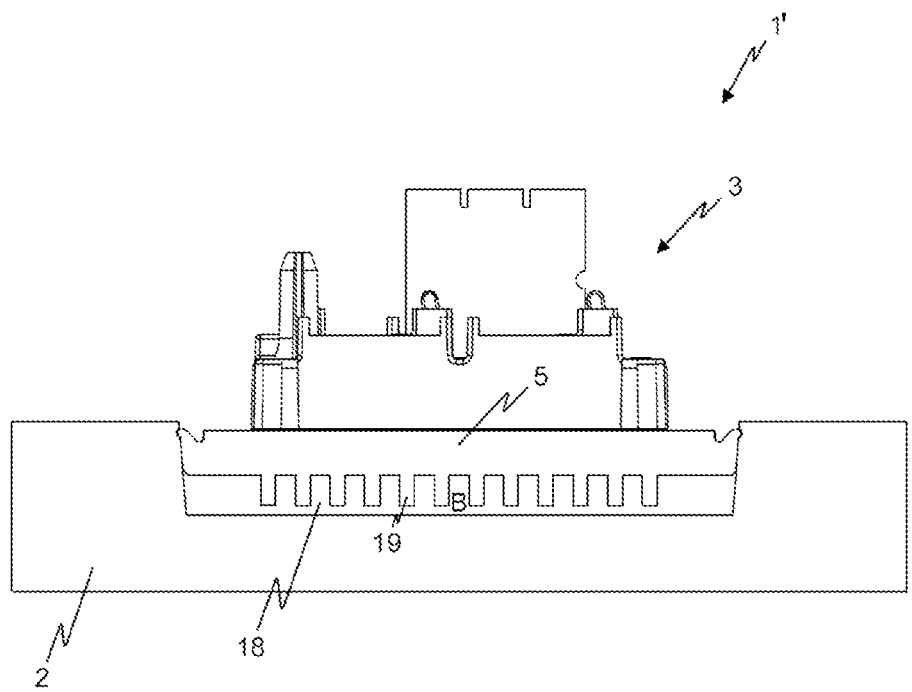
FIG. 8 shows a sectional view of a further power semiconductor device according to the invention.

FIG. 8 illustrates a sectional view of a further power semiconductor device 1' according to the invention, which corresponds to the power semiconductor device 1 in accordance with FIGS. 6 and 7 apart from the feature that heat sink 2 of the power semiconductor device 1' does not have a third surface 15 forming a stop for second surface 33 of cooling plate 5.

Figure 9:
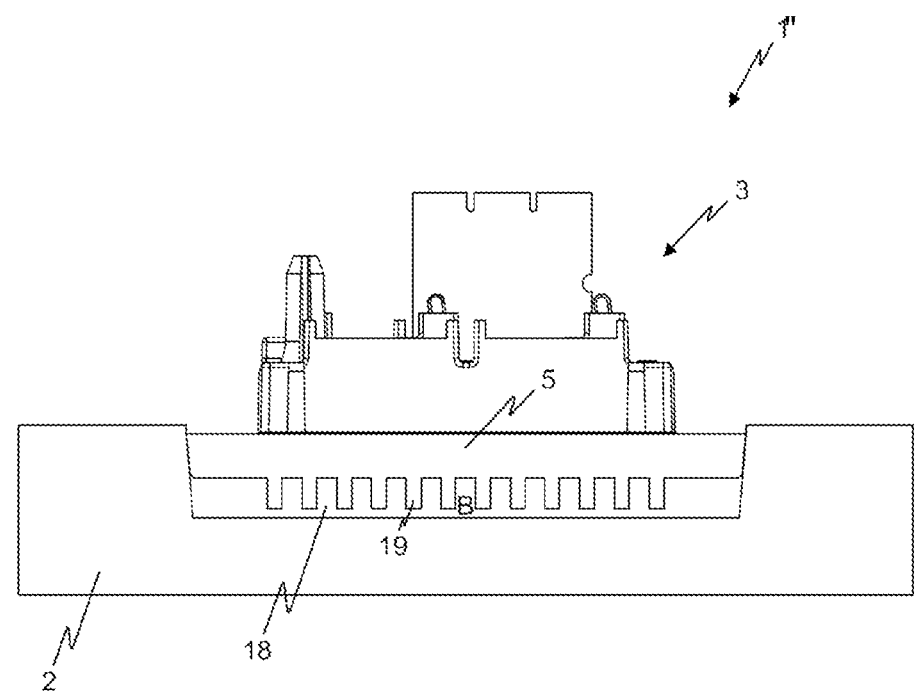
FIG. 9 shows a sectional view of a further power semiconductor device according to the invention.

FIG. 9 illustrates a sectional view of a further power semiconductor device 1'' according to the invention, which corresponds to the power semiconductor device 1' in accordance with FIG. 8 apart from the features that heat sink 2 does not have a first groove 36 and lateral edge region 29 of cooling plate 5 is not deformed. The cooling plate of power semiconductor device 1'' can—this not being illustrated in FIG. 9—also have the second groove 28, which, in conjunction with circumferentially extending edge 32 of press-fitting stamp 51 which engages into second groove 28, makes very precise arrangement of the cooling plate at the opening of the heat sink possible.

Figure 10:
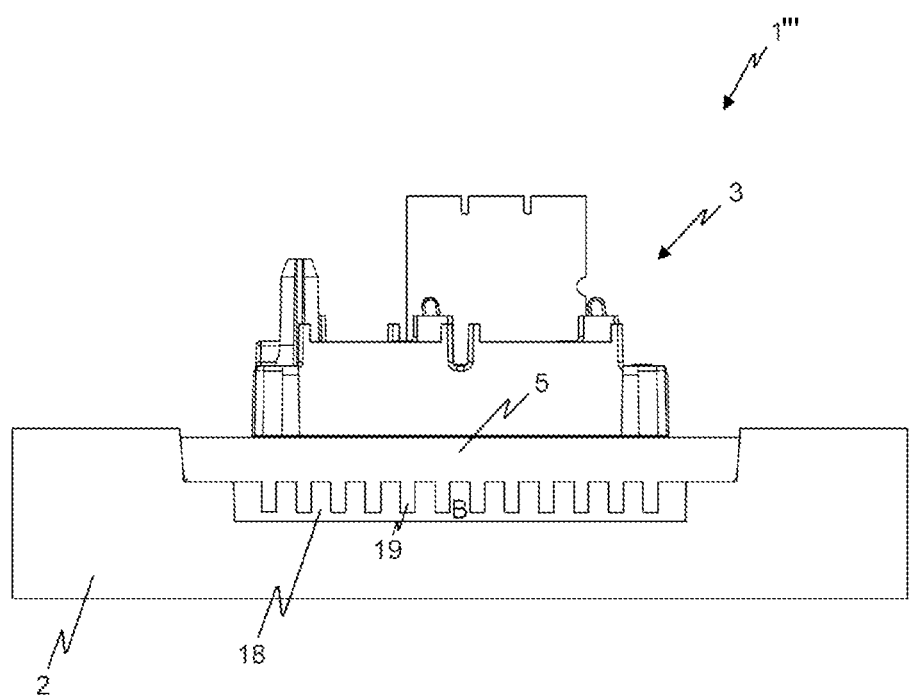
FIG. 10 shows a sectional view of a further power semiconductor device according to the invention.

FIG. 10 illustrates a sectional view of a further power semiconductor device 1''' according to the invention, which corresponds to the power semiconductor device 1 in accordance with FIG. 6 and FIG. 7 apart from the features that heat sink 2 does not have a first groove 36 and lateral edge region 29 of cooling plate 5 is not deformed. The cooling plate of the power semiconductor device 1''' in accordance with FIG. 10 can—this not being illustrated in FIG. 10—also have the second groove 28, which, in conjunction with the circumferentially extending edge 32 of press-fitting stamp 51 which engages into second groove 28, makes very precise arrangement of the cooling plate at the opening of the heat sink possible.

It should generally be noted that the inventive power semiconductor device can also comprise a plurality of power semiconductor modules 3, wherein, if inventive power semiconductor device 1 comprises a plurality of power semiconductor modules 3, heat sink 2 has a plurality of openings 25 in which the cooling plates 5 of the plurality of power semiconductor modules 3, as described above, are arranged and sealed in a liquid-tight manner in relation to heat sink 2. The method for producing a power semiconductor device proceeds, if the inventive power semiconductor device comprises a plurality of power semiconductor modules 3, in a form analogous to that described above.

Furthermore, it should be noted that heat sink 2 can be embodied integrally or from pieces connected to one another.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:
1. A power semiconductor device comprising:
a power semiconductor module having electrically conductive conductor tracks with at least one power semiconductor component arranged thereon;

a cooling plate, said cooling plate having a main surface facing said at least one power semiconductor component and a lateral first surface which extends circumferentially around said cooling plate and is at an angle (α) of less than about 90° with respect to said main surface of said cooling plate; and an electrically non-conductive insulation layer arranged between said conductor tracks and said cooling plate; and a heat sink through which a liquid can flow, said heat sink having an opening therein and a lateral first surface which delimits said opening and extends circumferentially around said opening;

wherein said first surface of said heat sink is at an angle (β) of less than about 90° with respect to said main surface of said cooling plate;

wherein said cooling plate is arranged in said opening;

wherein said lateral first surface of said cooling plate and said lateral first surface of said heat sink are arranged in a manner pressed against one another and extend circumferentially along said lateral first surface of said cooling plate and extend circumferentially along said lateral first surface of said heat sink;

wherein said heat sink has a lateral second surface which extends circumferentially around said opening;

wherein said opening is further delimited by said lateral second surface of said heat sink;

wherein said lateral second surface of said heat sink forms an inner surface of a first groove which extends circumferentially around said opening, and extends radially inwardly towards said cooling plate;

wherein said cooling plate has an edge region with a protuberance, said edge region extending circumferentially around said cooling plate, and extending outwardly towards said lateral second surface, and said protuberance being disposed in said first groove.

2. A power semiconductor device comprising:

a power semiconductor module having electrically conductive conductor tracks with at least one power semiconductor component arranged thereon;

a cooling plate, said cooling plate having a main surface facing said at least one power semiconductor component and a lateral first surface which extends circumferentially around said cooling plate and is at an angle (α) of less than about 90° with respect to said main surface of said cooling plate; and an electrically non-conductive insulation layer arranged between said conductor tracks and said cooling plate; and a heat sink through which a liquid can flow, said heat sink having an opening therein and a lateral first surface which delimits said opening and extends circumferentially around said opening;

wherein said first surface of said heat sink is at an angle (β) of less than about 90° with respect to said main surface of said cooling plate;

wherein said angle (β) is approximately equal to said angle (α);

wherein said cooling plate is arranged in said opening;

wherein said lateral first surface of said cooling plate and said lateral first surface of said heat sink are arranged in a manner pressed against one another and extend circumferentially along said lateral first surface of said cooling plate and extend circumferentially along said lateral first surface of said heat sink;

wherein said heat sink has a lateral second surface which extends circumferentially around said opening;

wherein said opening is further delimited by said lateral second surface of said heat sink ;

wherein said lateral second surface of said heat sink forms an inner surface of a first groove which extends circumferentially around said opening, and extends radially inwardly towards said cooling plate;

wherein said cooling plate has an edge region with a protuberance, said edge region extending circumferentially around said cooling plate, and extending outwardly towards said lateral second surface, and said protuberance being disposed in said first groove.

3. A power semiconductor device comprising:

a power semiconductor module having electrically conductive conductor tracks with at least one power semiconductor component arranged thereon;

a cooling plate, said cooling plate having a main surface facing said at least one power semiconductor component and a lateral first surface which extends circumferentially around said cooling plate and is at an angle (α) of between about 89.5° and about 85° with respect to said main surface of said cooling plate; and an electrically non-conductive insulation layer arranged between said conductor tracks and said cooling plate; and a heat sink through which a liquid can flow, said heat sink having an opening therein and a lateral first surface which delimits said opening and extends circumferentially around said opening;

wherein said first surface of said heat sink is at an angle (β) of less than about 90° with respect to said main surface of said cooling plate;

wherein said cooling plate is arranged in said opening;

wherein said lateral first surface of said cooling plate and said lateral first surface of said heat sink are arranged in a manner pressed against one another and extend circumferentially along said lateral first surface of said cooling plate and extend circumferentially along said lateral first surface of said heat sink;

wherein said heat sink has a lateral second surface which extends circumferentially around said opening;

wherein said opening is further delimited by said lateral second surface of said heat sink;

wherein said lateral second surface of said heat sink forms an inner surface of a first groove which extends circumferentially around said opening, and extends radially inwardly towards said cooling plate;

wherein said cooling plate has an edge region with a protuberance, said edge region extending circumferentially around said cooling plate, and extending outwardly towards said lateral second surface, and said protuberance being disposed in said first groove.

4. A power semiconductor device comprising:

a power semiconductor module having electrically conductive conductor tracks with at least one power semiconductor component arranged thereon;

a cooling plate, said cooling plate having a main surface facing said at least one power semiconductor component and a lateral first surface which extends circumferentially around said cooling plate and is at an angle (α) of between about 89.5° and about 85° with respect to said main surface of said cooling plate; and an electrically non-conductive insulation layer arranged between said conductor tracks and said cooling plate; and a heat sink through which a liquid can flow, said heat sink having an opening therein and a lateral first surface which delimits said opening and extends circumferentially around said opening;

wherein said first surface of said heat sink is at an angle (β) which is approximately equal to said angle (α);

wherein said cooling plate is arranged in said opening;

wherein said lateral first surface of said cooling plate and said lateral first surface of said heat sink are arranged in a manner pressed against one another and extend circumferentially along said lateral first surface of said cooling plate and extend circumferentially along said lateral first surface of said heat sink;

wherein said heat sink has a lateral second surface which extends circumferentially around said opening;

wherein said opening is further delimited by said lateral second surface of said heat sink;

wherein said lateral second surface of said heat sink forms an inner surface of a first groove which extends circumferentially around said opening, and extends radially inwardly towards said cooling plate;

wherein said cooling plate has an edge region with a protuberance, said edge region extending circumferentially around said cooling plate, and extending outwardly towards said lateral second surface, and said protuberance being disposed in said first groove.

5. A method for producing a power semiconductor device, the method comprising the following steps:

a) providing a power semiconductor module having electrically conductive conductor tracks with at least one power semiconductor component arranged thereon;

a cooling plate, said cooling plate having a main surface facing said at least one power semiconductor component and a lateral first surface which extends circumferentially around said cooling plate and is at an angle (α) of less than about 90° with respect to said main surface of said cooling plate; and an electrically non-conductive insulation layer arranged between said conductor tracks and said cooling plate;

b) providing a heat sink through which a liquid can flow, said heat sink having an opening therein and a lateral first surface which delimits said opening and extends circumferentially around said opening, and a lateral second surface which extends circumferentially around said opening and further delimits said opening;

c) arranging said cooling plate in said opening; and d) press-fitting said cooling plate into said opening so that said lateral first surface of said cooling plate and said lateral first surface of said heat sink are pressed against one another and extend circumferentially along said lateral first surface of said cooling plate and extend circumferentially along said lateral first surface of said heat sink;

e) forming an inner surface of a first groove which extends circumferentially around said opening with said lateral second surface of said heat sink, and also extends radially inwardly towards said cooling plate;

f) forming a protuberance in an edge region of said cooling plate, said protuberance extending circumferentially around said cooling plate, and extending radially outwardly from said cooling plate towards said inner surface; and g) positioning said protuberance in said first groove;

wherein said first surface of said heat sink is at an angle (β) of less than about 90° with respect to said main surface of said cooling plate.

6. The method of claim 5, wherein said step d) includes cutting a circumferentially extending second groove spaced apart from said first surface of said cooling plate into said main surface of said cooling plate.

7. The method of claim 5, wherein said main surface of said cooling plate has a circumferentially extending second groove spaced apart from said lateral first surface of said cooling plate.

8. The method of claim 5 wherein that the method is carried out by means of a tool having a press-fitting stamp and a deforming stamp;

wherein said step d) is carried out by means of said press-fitting stamp and wherein said step f) is carried out by means of said deforming stamp; and wherein said deforming stamp is arranged so as to be movable relative to said press-fitting stamp and laterally around said press-fitting stamp.

9. The method of claim 6 wherein that the method is carried out by means of a tool having a press-fitting stamp and a deforming stamp;

wherein said step d) is carried out by means of said press-fitting stamp and wherein said step f) is carried out by means of said deforming stamp; and wherein said deforming stamp is arranged so as to be movable relative to said press-fitting stamp and laterally around said press-fitting stamp.

10. The method of claim 7 wherein that the method is carried out by means of a tool having a press-fitting stamp and a deforming stamp;

wherein said step d) is carried out by means of said press-fitting stamp and wherein said step f) is carried out by means of said deforming stamp; and wherein said deforming stamp is arranged so as to be movable relative to said press-fitting stamp and laterally around said press-fitting stamp.

* * * * *